United States Patent [19]

Allred et al.

[11] 4,435,445
[45] Mar. 6, 1984

[54] PHOTO-ASSISTED CVD

[75] Inventors: David D. Allred, Troy; Lee Walter, Bloomfield Hills; Jaime M. Reyes, Birmingham; Stanford R. Ovshinsky, Bloomfield Hills, all of Mich.

[73] Assignee: Energy Conversion Devices, Inc., Troy, Mich.

[21] Appl. No.: 377,738

[22] Filed: May 13, 1982

[51] Int. Cl.³ .............................................. C23C 13/00
[52] U.S. Cl. ............................ 427/54.1; 204/157.1 R; 427/86
[58] Field of Search .................... 427/54.1, 53.1, 252, 427/86; 204/157.1 R, 152.1 H

[56] References Cited

U.S. PATENT DOCUMENTS

| | | | |
|---|---|---|---|
| 3,200,018 | 8/1965 | Grossman | 427/82 |
| 3,271,180 | 9/1966 | White | 430/319 |
| 3,490,961 | 1/1970 | Frieser et al. | 204/157.1 R |
| 3,661,637 | 5/1972 | Sirtl | 427/53.1 |
| 4,100,418 | 7/1978 | Brown | 250/510 |
| 4,340,617 | 7/1982 | Deutsch et al. | 204/157.1 H |
| 4,348,428 | 9/1982 | Rockley et al. | 427/86 |

OTHER PUBLICATIONS

White et al., "IBM TDB", vol. 5, No. 3, Aug. 1962, pp. 3,4.
Perkins et al., "The 147-nm Photolysis of Monosiline", Journal of the American Chemical Society, 101:5, 1979.
Krene et al., "Photolysis of Diborane at 1849A", Journal of Chemical Physics, vol. 37, No. 2, 1962.

Primary Examiner—John H. Newsome
Attorney, Agent, or Firm—Lawrence G. Norris

[57] ABSTRACT

A process and apparatus for depositing a film from a gas involves introducing the gas to a deposition environment containing a substrate, heating the substrate, and irradiating the gas with radiation having a preselected energy spectrum, such that a film is deposited onto the substrate. In a preferred embodiment, the energy spectrum of the radiation is below or approximately equal to that required to photochemically decompose the gas. In another embodiment, the gas is irradiated through a transparent member exposed at a first surface thereof to the deposition environment, and a flow of substantially inert gaseous material is passed along the first surface to minimize deposition thereon.

7 Claims, 3 Drawing Figures

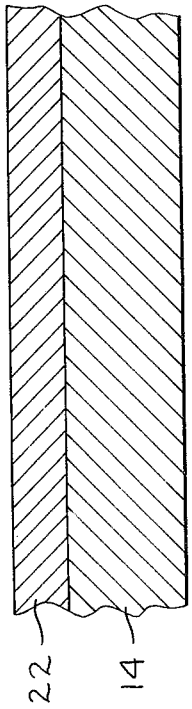
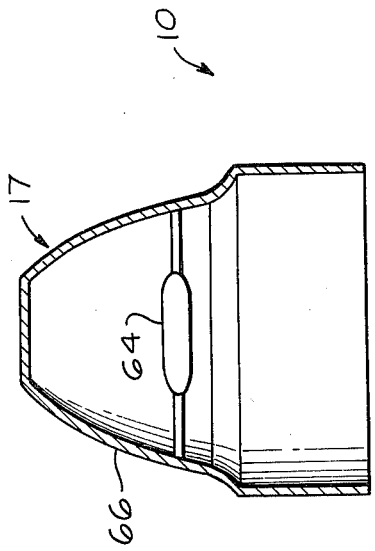
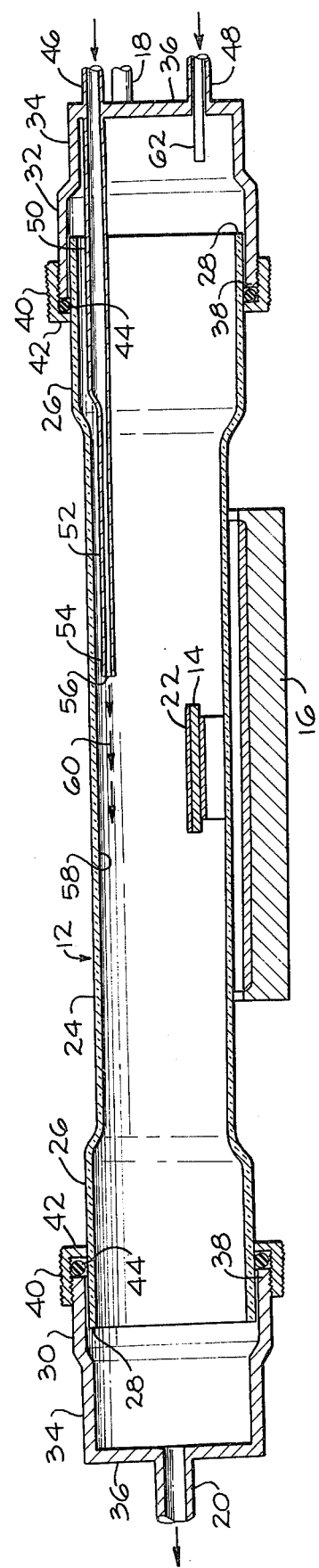
FIG. 1
FIG. 3

PHOTO-ASSISTED CVD

BACKGROUND OF THE INVENTION

This invention relates generally to the art of depositing films and, more particularly, to an improved process and apparatus for photo-assisted chemical vapor deposition.

Thin silicon and germanium films have been formed by chemical vapor deposition (CVD) techniques which involve bringing $SiH_4$ or $GeH_4$, respectively, in contact with a hot substrate. Some of the gas molecules pyrolize, releasing Si and Ge atoms which remain on the surface and $H_2$ molecules which are carried away by the gas stream. This pyrolysis reaction, like other reactions used in CVD, is an "activated" process. That is, it proceeds more slowly as temperatures are decreased. Substantial deposition rates can therefore be achieved with CVD only at temperatures on the order of 400 degrees Celsius or higher.

In many cases, it is desirable to minimize deposition temperatures. For example, some deposited films, particularly amorphous ones, are adversely affected by the temperatures required for conventional CVD. A substrate or device onto which a film is deposited can also be harmed by these temperatures.

Plasmas or glow discharges have been used to facilitate deposition at lower temperatures, with some success. However, the existence of the plasma places an entirely different set of constraints on a deposition environment, including substantial temperatures. In some cases, the ion bombardment which occurs in plasma deposition can be deleterious to film properties.

In a somewhat different context, ultraviolet (UV) radiation has been used to decompose gases by photolysis, causing deposition of elements from the gases. Examples of this work are found in A. Perkins et al., "The 147-nm Photolysis of Monosilane", Journal of the American Chemical Society, 101:5, 1979, and W. C. Krene "Photolysis of Diborane at 1849A", Journal of Chemical Physics, Vol. 37, No. 2, 1962, wherein UV radiation having a wavelength less than 2,000 angstroms is used to decompose $SiH_4$ and $B_2H_6$, respectively. However, UV radiation of less than 2,000 angstroms can be destructive to the constituent elements of many films, and to the deposited films themselves.

Therefore, in many applications it is desirable to deposit films at low temperatures, free of plasma-sustaining conditions and without subjecting the deposition gases or the films to energetic short wavelength radiation.

SUMMARY OF THE INVENTION

The present invention comprises a process and apparatus for depositing a material onto a substrate from a gas containing at least one constituent element of the material, comprising: introducing a gas to a deposition environment containing the substrate; heating the substrate; and irradiating the gas with radiation having an energy spectrum above a threshold energy level, such that a film containing the material is deposited onto the substrate. In a preferred embodiment, the energy spectrum of the radiation is below that required to photochemically decompose the gas, i.e., below the "photodissociation limit" of the gas, and the radiation is ultraviolet light. In another embodiment, the radiation is passed through a transparent member exposed at a first surface thereof to the deposition environment, and a flow of substantially inert gaseous material is established along the first surface to minimize deposition thereon. The deposition gas may comprise any of a wide variety of metal or semiconductor containing gases, including a number of metal carbonyls, silane and germane. When silane, germane, or a combination thereof is used, the deposited film will typically be amorphous silicon, germanium, or amorphous Ge-Si, respectively.

The present invention thus combines the decomposing effects of heat and ultraviolet radiation to deposit semiconductor or metallic films at relatively low temperatures. The adverse effects of elevated temperatures are therefore avoided. This is accomplished without constraining the deposition environment to that able to support a plasma or, in the preferred embodiment in which the radiation lacks the energy to photochemically decompose the gas, without subjecting the deposited film or the substrate to the more energetic short wavelength radiation. Photoionization and bombardment of the film with ions are also avoided.

Because irradiation is accomplished through a transparent portion of a deposition chamber, the process of the present invention can be severely limited by deposition of the film material onto the transparent portion. If material is allowed to deposit on the window, it eventually becomes opaque and blocks out the radiation entirely. However, the buildup of such material is limited in the present invention by establishing a flow of substantially inert gaseous material along the inner surface of the transparent portion. Chemical vapor in the area of the transparent portion is carried away by the inert gaseous material before it can deposit thereon. Substantially thicker films are obtainable in this way.

It is contemplated that radiation having an energy spectrum below the photodissociation limit of the deposition gas will be used in the practice of the present invention most often when relatively thin films are desired. This is because deposition rates at these energy levels are somewhat less than those obtainable in some other forms of deposition. However, in many cases it is desirable to provide relatively thin films at low temperatures, and without subjecting the sample to high energy radiation. In such cases, the present invention can provide high quality films of several hundred angstroms or less.

BRIEF DESCRIPTION OF THE DRAWINGS

The above and other objects of the present invention may be more fully understood from the following detailed description, taken together with the accompanying drawings, wherein similar reference characters refer to similar elements throughout and in which:

FIG. 1 is a fragmentary vertical sectional view of a substrate upon which a film has been deposited in accordance with the present invention;

FIG. 3 is a vertical sectional view taken along the line 3—3 of FIG. 2.

DESCRIPTION OF THE PREFERRED EMBODIMENTS

Figure 2:
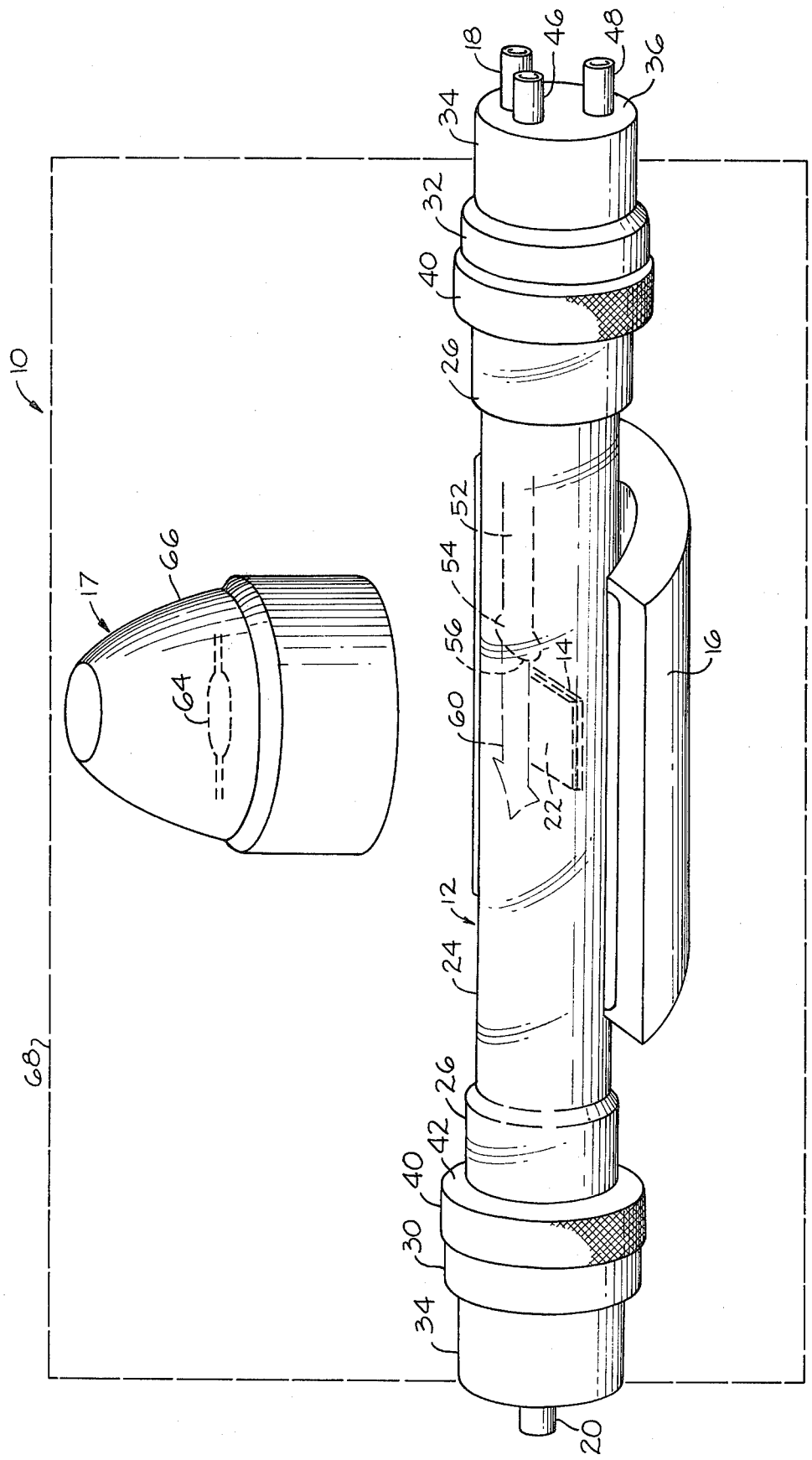
FIG. 2 is a perspective view of a deposition apparatus constructed in accordance with a preferred embodiment of the present invention.

Referring now to the drawings, there is illustrated in FIGS. 2 and 3 a deposition apparatus embodying the present invention, generally designated 10. The apparatus 10 comprises a transparent tubular chamber 12 containing a substrate 14. The substrate is heated by a radiant heater 16 as the chamber is irradiated by a light source 17. Molecules of deposition gas passing from an inlet 18 to an outlet 20 at opposite ends of the chamber 12 receive photon energy from the light source 17 in the area of the substrate. Many of the gas molecules also collide with the substrate 14, receiving thermal energy therefrom. It is the combination of energy from these sources which causes the molecules to decompose in the area of the substrate, releasing semiconductor or metal atoms for formation of a film 22. In a preferred embodiment, the photon energy of the light source is below the photodissociation limit of the deposition gases (in the absence of heat) and the temperature of the substrate is below the minimum required for pyrolysis of the gases. Each energy source, working alone, is then incapable of causing the gas to dissociate and deposit onto the substrate. However, the combined effects of the light source 17 and the radiant heater 16 permit the deposition process to proceed. During the process, the substrate 14 and the film 22 are spared from the damaging effects of high energy radiation and high deposition temperatures.

The film 22 deposited in accordance with the present invention is depicted generally in FIG. 1, in conjunction with the substrate 14. Although the film 22 may in some cases be crystalline, it will most commonly be an amorphous (also designated "a") semiconductive or metallic film. For example, the film 22 may be a-Si, a-Ge, a-GeSi, or a suitable amorphous metallic film. Of these, it is believed that a-GeSi and many amorphous metallic films have not previously been produced by CVD processes because the temperature of prior art processes has been too high.

While in some cases it is desirable to produce a film 22 having a thickness in the tens of angstroms, it is anticipated that films produced in accordance with the present invention will more commonly have thicknesses in the hundreds of angstroms. The substrate 14 may be made of glass or other suitable material, or may be part of an electronic device in an unfinished state. In the latter case it may be desirable to mask certain portions of the device to produce a discontinuous film thereon.

Referring now to FIGS. 2 and 3 in greater detail, the tubular chamber 12 comprises a central quartz portion 24 having relatively short quartz portions 26 of somewhat greater diameter at opposite ends thereof. The outer ends 28 of the quartz portions 26 are closed by a pair of end fittings 30 and 32 to complete the chamber. Each of the end fittings includes a sleeve portion 34 extending from a closed end 36 to an open end portion 38. The open end portion is provided with a region of somewhat increased diameter for reception of one of the quartz portions 26, and is threaded to receive a collar 40 having an inwardly extending annular flange 42 at one end thereof. An o-ring 44 is confined in a space between the flange 42 and the end portion 38 for compression thereof against the quartz portion 26. An airtight seal is provided in this way between the end fittings 30 and 32 and the tubular chamber 12.

The end fittings 30 and 32 are preferably made of stainless steel or other suitable noncorrosive metal, with the closed ends 36 being welded or otherwise permanently joined to the sleeve portions 34. The closed end 36 of the end fitting 32 is provided with an inert gas inlet 46 and a thermocouple inlet 48 in addition to the deposition gas inlet 18 described above. The inlets 18 and 48 may terminate at the inner wall of the closed end 36, while the inlet 46 preferably extends substantially longitudinally into the chamber 12 to a location short of the substrate 14. The gas inlet 46 includes a first region 50 of circular cross section, a flattened region 52 and a nozzle 54. The nozzle 54 defines at least one orifice 56 located adjacent to an inner surface 58 of the chamber. Inert gas introduced through the inlet 46 is emitted along the surface 58 by the nozzle 54, at a location between the substrate 14 and the light source 17. This gas flow establishes a curtain 60 of inert gas, as indicated in FIGS. 2 and 3, which acts as a barrier between the deposition gas and the portion of the chamber surface 58 through which light is passed. The inert gas carries away deposition gas molecules to minimize deposition on that portion of the chamber surface.

The gas inlets 18 and 46 are preferably connected to a conventional gas rack (not shown) for establishing regulated flows of deposition gas and inert gas, respectively, therein. A thermocouple 62 extends through the inlet 48 for monitoring the gas temperature within the chamber. The outlet 20 is provided at the closed end 36 of the end fitting 30 for initial evacuation of the chamber and withdrawal of inert and deposition gas during operation.

The central length 24 of the tubular chamber 12 preferably comprises a length of synthetic quartz tubing having an outside diameter of approximately one and one-half inches. A suitable synthetic quartz tubing is manufactured by American Quartz under the name Suprasil. The relatively short portions 26 may then comprise less expensive ordinary quartz tubing fused to opposite ends of the lengths 24. The portions 26 are preferably 2" in outside diameter for connection to the end fittings 30 and 32. Synthetic quartz is used for the central length 24 because it has a very low alumina content and is much more transparent than ordinary quartz to light having a wavelength of less than 3000 angstroms.

The light source 17 preferably comprises a Hg vapor lamp 64 positioned within a reflective housing 66 for concentration of UV light onto the chamber 12. Although the light source is illustrated in FIGS. 2 and 3 as being spaced somewhat from the chamber, in practice the light source is placed as close as possible to the chamber to maximize transmission of its output to the deposition gas. From a practical standpoint, the minimum distance between the lamp 64 and the chamber is established by design of the housing 66 to be between two and one-half and three inches. When used in an air atmosphere, the most energetic spectral line reaching the deposition gas from the lamp 64 is the 2537 angstrom line of Hg. The 1849 angstrom line of the lamp is more energetic and penetrates synthetic quartz well, but is strongly absorbed by air. In cases in which it is desired to irradiate the deposition gas with 1849 angstrom light, the light source 17 and the chamber 12 can be placed within an optional dry nitrogen environment 68, as indicated diagrammatically by the broken line of FIG. 2. This increases the transmission of the more energetic photons into the tube.

The radiant heater 16 preferably comprises a conventional resistive or tungsten/halogen lamp. Heat is transmitted to the substrate 14 and the chamber 12 by radiation, without significant direct heating of the deposition gas. Alternatively, a resistive heating arrangement (not shown) may be provided within the chamber 12 for heating the substrate 14. In that case, power lines for the heating element would be passed through the closed end 36 of one of the end fittings.

The deposition apparatus 10 may be operated in either a "static" mode, in which the chamber 12 is closed off during deposition, or a "dynamic" mode, in which a continuous flow of reactant deposition gas is established through the chamber 12 from the inlet 18 to the outlet 20. The gas curtain 60 is preferably established in the dynamic mode to prevent the light path through the quartz chamber from being obscured by deposition thereon.

In the static mode, the tubular chamber 12 is initially evacuated through the outlet 20 and back-filled with deposition gas to a desired pressure, typically between 100 and 140 Torr. The chamber is then closed off and heated with the radiant heater 16 until a desired deposition temperature is reached. The light source 18 is turned on to begin the deposition reaction. Basic operating parameters of the apparatus 10 in the static mode are listed in Table 1 for a number of different film depositions. The characteristics of films produced under the conditions of Table 1 are shown in Table 2. Each of the films was found to be amorphous, and the letters "PAC" preceding the numbers of the films signify that they were produced by photoassisted CVD.

With reference to Table 1, it can be seen that PAC films have been deposited according to the present invention at temperatures of between 100 and 162 degrees less than the threshold temperature at which conventional CVD processes are possible. Thus, while conventional CVD depositions of Si involving a pyrolysis of silane gas require temperatures on the order of 400 degrees C., photoassisted CVD of Si has been achieved at temperatures as low as 300 degrees C. Similarly, while conventional CVD of Ge requires a substrate temperature of approximately 362 degrees C., photoassisted CVD of Ge has been achieved at 200 degrees C. Amorphous Ge-Si films have also been produced by photoassisted CVD at as low as 250 degrees C., whereas applicants are not aware of amorphous Ge-Si films ever being deposited by conventional CVD.

With reference to Table 2, the film compositions shown therein were determined by electron spectroscopy (ESCA). The oxygen and carbon contents seen in the Si depositions of the first series may be real, that is, built into the film from oxygen and other elements in the chamber during deposition, or they may be nothing more than contamination of the upper or lower surfaces of film. The Mg and Cl in the film PAC 0 is from the substrate, a sodalime microscope slide.

The Ge-Si films were deposited from a mixture of silane and germane in the static system. Germanium is preferentially deposited, probably because the 2537 angstrom UV light is more strongly absorbed by germane than by silane.

The dark and light conductivities of the deposited films are also shown in Table 2. The majority of the films exhibited photothermal action. However, the conductivity values listed in Table 2 were measured in a gap geometry such that a surface current, if any, would contribute to the measured current.

In the static mode, a typical deposition run was begun at low temperature. If no film was deposited in a few minutes, the temperature was increased by 25 to 50 degrees Celsius and the irradiation cycle was repeated. Once the temperature threshold for film growth was established, the substrates were removed and characterized. In subsequent depositions using the same gas composition, the substrate temperature was maintained at or above the threshold. In this context, it was discovered that the radiation was essential for deposition. Even with the temperature maintained at the threshold level, no film could be deposited until the chamber was illuminated. This result, in combination with the fact that the threshold temperature was substantially below that required for conventional CVD, shows that the depositions of Tables 1 and 2 involve true photoassisted CVD.

However, the static mode of operation described above is a self-limiting process because deposition is allowed to occur on the interior walls of the chamber 12 as well as on the sample. The transparent "window" provided by the quartz tube 24 between the light source 17 and the substrate 14 thus gradually becomes opaque as the film deposited thereon becomes thicker. The absorption coefficient of both silicon and germanium at 2537 angstroms is greater than $1.0 \times 10_6$ per centimeter, indicating that virtually all of the light would be absorbed by a film on the order of 10 nanometers thick. In practice, it has been found that film deposition ceases in the static mode after the film on the substrate has become approximately 15 to 20 nanometers thick. At that point, no more UV radiation can enter the chamber to excite the deposition gas. In Table 2, the thickest GeSi film is the product of a number of sequential depositions.

The gas curtain 60 used in the dynamic mode of the apparatus 10 is designed to carry the excited deposition atoms away from the "window" area of the chamber 12, minimizing deposition thereon. The window thus remains unobscured for a much longer time, permitting deposition of much thicker films.

Operation of the apparatus 10 in the dynamic mode is initiated by evacuation of the chamber 12 through the outlet 20. A flow of deposition gas from the inlet 18 to the outlet 20 is then initiated, preferably along with a flow of inert gas through the inlet 46. The chamber 12 and the substrate 14 are then heated to the desired temperature by the radiant heater 16 and the chamber is irradiated by the light source 17. A number of operating parameters of the apparatus 10 in the dynamic mode are shown in Table 3. As seen in Table 3, amorphous germanium, boron, and molybdenum films have been deposited in this mode with total chamber pressures between 16.8 and 65.2 Torr. As described above in relation to the static mode of operation, dynamic photoassisted CVD has been accomplished at temperatures substantially below those required for conventional CVD. Thus, temperatures differences ($\Delta T$) of between 60 and 102 degress Celsius have been achieved.

When a low pressure 100 watt Hg vapor lamp is used in the light source 17, the most energetic spectral line produced by the lamp is the 1849 angstrom line of Hg. However, light of this wavelength is absorbed strongly by air, preventing it from reaching the chamber 12. The most energetic line reaching the gas inside the tube is therefore the 2537 angstrom line of Hg. However, the optional dry nitrogen environment 68 of FIG. 2 may be used, if desired, to prevent absorption of the 1849 angstrom radiation. Although radiation of that wavelength is not essential for the depositions of Tables 1 through 3, it may be desired in some cases.

It will be understood that while the discussion herein primarily involves the deposition of Si, Ge, Ge-Si, B and Mo, the process and apparatus of the present invention are applicable to deposition of a wide variety of semiconductor and metallic compounds from a large number of deposition gases. The gases considered most useful for deposition in the context of the present invention are, without limitation: $SiH_4$, $GeH_4$, $B_2H_6$, $Mo(CO)_6$, $W(CO)_6$, $Cr(CO)_6$, $Co(NO)(CO)_3$, $PH_3$, $NH_3$, $N_2H_4$, $C_2H_2$, $N_2O$, $NoCl$, $H_2S$ and $NCl_3$.

Each of the gases listed above has a characteristic photodissociation limit, which is expressed as a minimum energy level or maximum wavelength of light required to dissociate the gas by photolysis in the absence of external heating. The photodissociation limits of these gases can be determined by experiment in a manner well known to those skilled in the art. In many cases it will be desired to deposit films in accordance with the present invention using radiation having wavelengths somewhat greater than the dissociation limit while simultaneously heating the substrate.

The major concern in choosing a gas for photoassisted deposition of a film according to the present invention is that the light or other radiation adequately "couple" or be absorbed by the particular gas. If the gas does not absorb the radiation, the deposition process will not be assisted thereby. Similarly, a different source of radiation can be substituted for the Hg vapor lamp of the light source 17, but only if the deposition gas or gases will absorb radiation within the spectral range of the source and derive sufficient energy from it to aid in deposition. The choices of deposition gases and radiation sources to be used in the practice of the invention are therefore interdependent, requiring a matching of absorption characteristics to radiation output.

From the above, it can be seen that there has been provided a process and apparatus for depositing films from deposition gases without subjecting the gases or the substrates to the temperatures required for pyrolysis or the radiant energy levels required for photolysis.

TABLE 1

OPERATING PARAMETERS (STATIC MODE)

| | SYSTEM PRESSURE (torr) | SYSTEM TEMPERATURE (°C.) (PAC) | SYSTEM TEMPERATURE (°C.) (CVD) | ΔT (°C.) | RATE OF DEPOSITION (nm/min) |
|---|---|---|---|---|---|
| Si | | | | | |
| PAC 1A | 100 | 300 | 400 | 100 | .07 |
| PAC 1B | 100 | 325 | | 75 | .083 |
| PAC 1C | 100 | 350 | | 50 | .4 |
| PAC 0 | 100 | 400 | | 0 | 1.9 |
| Ge | | | | | |
| PAC 2A | 100 | 200 | 362 | 162 | .13 |
| PAC 2 | 100 | 250 | | 112 | .33 |
| Ge—Si | | | | | |
| PAC 3C | 140 | 250 | 400 | 150 | .1 |
| PAC 3B | 140 | 325 | | 75 | 1.33 |
| PAC 3A | 140 | 325 | | 75 | 1.33 |

TABLE 2

RESULTS (STATIC MODE)

| | THICKNESS (nm) | AMORPHOUS COMPOSITION | CONDUCTIVITY (DARK) | CONDUCTIVITY (LIGHT) |
|---|---|---|---|---|
| Si | | | | |
| PAC 1A | 20 | 41.9% Si, 51.3% O, 6.3% C | $5 \times 10^{-10}$ | $3 \times 10^{-7}$ |
| PAC 1B | | 41.9% Si, 51.3% O, 6.3% C | | |
| PAC 1C | 5 | 41.9% Si, 51.3% O, 6.3% C | | |
| PAC 0 | 57 | 73% Si, 12% Mg, 3.1% C, 10.3% O, 1.5% Cl | $7 \times 10^{-9}$ | $3 \times 10^{-8}$ |
| Ge | | | | |
| PAC 2 | 21 | 100% Ge | $6.25 \times 10^{-5}$ | $3.05 \times 10^{-4}$ |
| PAC 2A | 5 | 100% Ge | $1.0 \times 10^{-5}$ | $3.2 \times 10^{-4}$ |
| PAC 2B | 3 | 100% Ge | $1.1 \times 10^{-5}$ | $7.75 \times 10^{-4}$ |
| Ge—Si | | | | |
| PAC 3C | 5 | 93.4% Ge, 6.6% Si | $1.2 \times 10^{-5}$ | $5.5 \times 10^{-5}$ |
| PAC 3B | 45 | 87.2% Ge, 12.3% Si | $1.4 \times 10^{-5}$ | $1.8 \times 10^{-5}$ |
| PAC 3A | 100 | 92.4% Ge, 8.6% Si | $1.8 \times 10^{-5}$ | $1.8 \times 10^{-5}$ |

TABLE 3

OPERATING PARAMETERS (DYNAMIC MODE)

| | Ge GERMANIUM | B BORON | Mo MOLYBDENUM |
|---|---|---|---|
| SYSTEM PRESSURE | $x = GeH_4$ | $x = B_2H_6$ | $X = Mo(CO)_6 + N_2$ |
| $P(N_2)$ (torr) | 15.2 | 4.7 | 45.2 |
| P(x) (torr) | 6.6 | 12.1 | 20 |
| $P_{TOTAL}$ (torr) | 21.8 | 16.8 | 65.2 |
| SYSTEM TEMPERATURE | | | |
| PAC (°C.) | 260 | 283 | 190 |
| CVD (°C.) | 362 | 377 | 250 |
| ΔT | 102 | 94 | 60 |
| RATE OF DEPOSITION (nm/min) | .44 | 8.3 | 1.5 |

What is claimed is:

1. A process for making an amorphous silicon and germanium alloy film comprising:
    providing a gas comprising silane and germane in a deposition environment containing the substrate;
    heating the substrate below the temperature required for pyrolysis of the silane and germane;
    irradiating the silane and germane with radiation below an energy level required to photochemically decompose the gas; and
    the combination of heat and radiation causing deposition of an amorphous silicon and germanium alloy film on the substrate.

2. The process of claim 1 wherein the substrate is heated to a temperature of at least about 250° C.

3. The process of claim 1 wherein the radiation is ultraviolet light.

4. The process of claim 3 wherein the ultraviolet light has a wavelength of greater than 2,000 Å.

5. The process of claim 1 wherein the radiation is passed through a transparent member exposed at a first surface thereof to the deposition environment, and the process further comprises establishing a flow of substantially inert gaseous material along the first surface to minimize deposition thereon.

6. The process of claim 5 wherein the step of establishing the flow comprises producing a laminar gas curtain along the first surface.

7. The process of claim 1 wherein the gas in the deposition environment consists essentially of silane and germane.

* * * * *

UNITED STATES PATENT AND TRADEMARK OFFICE
CERTIFICATE OF CORRECTION

PATENT NO. : 4,435,445
DATED : March 6, 1984
INVENTOR(S) : David D. Allred, et al It is certified that error appears in the above-identified patent and that said Letters Patent is hereby corrected as shown below:

Col. 2, line 60, after "a" insert -- longitudinal -- and delete "taken along the line"; line 61, delete "3-3" and after "2" insert -- taken substantially perpendicular to the substrate --. Col. 6, line 18, delete "$10_6$" and insert -- $10^6$ --; line 33, delete "much". Col. 7, line 15, after "than" insert -- those of --.

Signed and Sealed this

Third Day of December 1985

[SEAL]

Attest:

DONALD J. QUIGG

Attesting Officer

Commissioner of Patents and Trademarks